US012578803B2

(12) United States Patent
Guédat et al.

(10) Patent No.: US 12,578,803 B2
(45) Date of Patent: Mar. 17, 2026

(54) CAPACITIVE SENSING FOR AN AR/VR STYLUS DEVICE

(71) Applicant: Logitech Europe S.A., Lausanne (CH)

(72) Inventors: Olivier Guédat, Vufflens-la-Ville (CH); David Brown, Cork (IE); Huagui Tan, Suzhou City (CN); Yuehe Chen, Suzhou City (CN); Xuesong Li, Suzhou City (CH); Qifei Cai, Suzhou City (CN); Yungao Dai, Suzhou City (CN); Hua Zhao, Suzhou City (CN); JianZhong Fan, Suzhou City (CN)

(73) Assignee: Logitech Europe S.A., Lausanne (CH)

( * ) Notice: Subject to any disclaimer, the term of this patent is extended or adjusted under 35 U.S.C. 154(b) by 13 days.

(21) Appl. No.: 18/882,009

(22) Filed: Sep. 11, 2024

(65) Prior Publication Data

US 2025/0377735 A1     Dec. 11, 2025

Related U.S. Application Data

(63) Continuation of application No. PCT/CN2024/098309, filed on Jun. 10, 2024.

(51) Int. Cl.
| | |
|---|---|
| *G06F 3/02* | (2006.01) |
| *G06F 3/0354* | (2013.01) |
| *H03K 17/975* | (2006.01) |
| *G06F 3/03* | (2006.01) |

(52) U.S. Cl.
CPC ........ *G06F 3/0202* (2013.01); *G06F 3/03545* (2013.01); *G06F 3/0308* (2013.01); *H03K 17/975* (2013.01)

(58) Field of Classification Search
CPC ................................................... H03K 17/975
See application file for complete search history.

(56) References Cited

U.S. PATENT DOCUMENTS

| | | | | |
|---|---|---|---|---|
| 4,458,293 | A  * | 7/1984 | Cherry | ................... H03K 17/98 200/600 |
| 5,667,319 | A  * | 9/1997 | Satloff | .................. G06F 3/0219 400/472 |
| 9,727,150 | B2 * | 8/2017 | Stern | ........................ G06F 3/041 |
| 11,079,812 | B1 * | 8/2021 | Bushnell | ............... G06F 1/1626 |
| 2007/0103451 | A1 * | 5/2007 | Heimann | ............. H03K 17/962 345/173 |
| 2013/0170013 | A1 * | 7/2013 | Tonar | ...................... G02F 1/161 359/296 |
| 2014/0300585 | A1 * | 10/2014 | Dowd | ................. G06F 3/04162 345/179 |
| 2015/0091844 | A1 * | 4/2015 | Ho | ....................... G06F 3/03545 345/174 |
| 2016/0195980 | A1 * | 7/2016 | Liao | ...................... G06F 3/0447 345/174 |
| 2022/0216868 | A1 * | 7/2022 | Yamabayashi | ......... H01H 36/00 |

\* cited by examiner

*Primary Examiner* — Curtis A Kuntz
*Assistant Examiner* — Jerold B Murphy
(74) *Attorney, Agent, or Firm* — Kilpatrick Townsend & stockton

(57)     ABSTRACT

A capacitive button for an input device with a curved housing is provided. A button cap extends through an opening in the curved housing. A capacitive sensing electrode is mounted below the button. A conductive element extends from the capacitive sensing electrode into the button. The conductive element is shaped such that it is closer to a top surface of the button than a side surface of the curved housing.

6 Claims, 11 Drawing Sheets

306

314

302

CLICK:   A Button  312
DOUBLE TAP: B Button

PRESSURE: Trigger 310

TIP: Thumbstick x-axis 304

CLICK: Grab Button 308

Mount button structures on a flexible PCB.

1102

Curl the PCB into a cylinder.

1104

Insert the curled PCB into a stylus housing until the button structures reach button holes in the stylus housing.

1106

Insert pogo pins into the front and back button caps.

1108

Attach the button caps to the button structures using two-sided adhesive tape.

1110

CAPACITIVE SENSING FOR AN AR/VR STYLUS DEVICE

CROSS REFERENCE PARAGRAPH FOR PRIORITY

This application is bypass continuation of PCT Application No. PCT/CN2024/098309, filed on Jun. 10, 2024, and titled "CAPACITIVE SENSING FOR AN AR/VR STYLUS DEVICE," which is hereby incorporated by reference in its entirety for all purposes.

BACKGROUND

Virtual, mixed, or augmented reality can be associated with a variety of applications that comprise immersive, highly visual, computer-simulated environments. These environments, commonly referred to as augmented-reality (AR), virtual-reality (VR), and mixed-reality (MR) environments, can simulate a physical presence of a user in a real or imagined world. The computer simulation of these environments can include computer rendered images, which can be presented by means of a graphical display. The display can be arranged as a head mounted display (HMD) that may encompass all or part of a user's field of view.

A user can interface with the computer-simulated environment by means of a user interface device or peripheral device. A common controller type in many contemporary AR/VR systems is the pistol grip controller, which can typically operate with three or six degrees-of-freedom (DOF) of tracked movement, depending on the particular system. When immersed in a computer-simulated AR/VR environment, the user may perform complex operations associated with the interface device, including simulated movement within the AR/VR virtual environment, virtual object interaction and manipulation, and more. Despite their usefulness, pistol grip controllers in contemporary AR/VR systems tend to be bulky, unwieldy, cumbersome, and can induce fatigue in a user due to its weight and large tracking features that often include an obtrusive and protruding donut-shaped structure. The pistol grip shape can help minimize fatigue as a user can typically hold objects in a pistol grip configuration for longer periods of time, but at the cost of only allowing coarse and inarticulate movement and ungainly control.

Stylus devices can allow a user to articulate precise movements with a high degree of control, due in part to the stylus's similarity with typical handheld writing utensils, such as pens and pencils. Stylus use in an AR/VR environment can present many advantages over real world writing implements including 3D writing, object scaling, etc., which can give a user many drafting and editing options not available in the real world. Despite their usefulness, the form factor of a stylus presents challenges in manufacturing. The stylus buttons will protrude from the stylus so that the user can feel the button in a VR environment. If capacitive detection buttons are used, the stylus is very slim, with a curved housing, and thus the capacitive sensing electrode can be closer to the stylus' side than the button top. When the user grabs the stylus, it can cause side interference issue and the touch sensor will generate an incorrect touch event report, thinking the button has been pressed. An improved button capacitive button design is needed to address such deficiencies.

Unless otherwise indicated herein, the materials described in this section of the specification are not prior art to the claims in this application and are not admitted to be prior art by inclusion in this section.

BRIEF SUMMARY OF THE INVENTION

In embodiments, a capacitive button for an input device with a curved housing is provided. A button cap extends through an opening in the curved housing. A capacitive sensing electrode is mounted below the button. A conductive element extends from the capacitive sensing electrode into the button. The conductive element is shaped such that it is closer to a top surface of the button than a side surface of the curved housing.

In embodiments, the conductive element has a self-adjusting length to accommodate depression of the button cap, such as a spring. In one embodiment, the conductive element is a pogo pin with an internal spring. In one embodiment, the input device is a stylus, although other input devices with a curved surface could implement the capacitive button, such as a computer mouse.

In embodiments, a distance between the conductive element and a top surface of the button cap is 1 millimeter or less. A distance between the conductive element and a top surface of the button cap is less than half a distance between the capacitive sensing electrode and the curved housing. In one embodiment, a switch is mounted below the capacitive sensing electrode to provide a click function.

In embodiments, a method for assembling the buttons into the stylus is provided. Button structures are mounted on a flexible PCB. The PCB is curled into a curled PCB shape. The curled PCB is inserted into a stylus housing until the button structures reach button holes in the stylus housing. Pogo pins are inserted into the front and back button caps (e.g., using a press-fit or over-molding). The button caps are then attached to the button structures using an adhesive (e.g., two-sided adhesive tape).

This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim.

The foregoing, together with other features and examples, will be described in more detail below in the following specification, claims, and accompanying drawings.

The terms and expressions that have been employed are used as terms of description and not of limitation, and there is no intention in the use of such terms and expressions of excluding any equivalents of the features shown and described or portions thereof. It is recognized, however, that various modifications are possible within the scope of the systems and methods claimed. Thus, although the present system and methods have been specifically disclosed by examples and optional features, modification and variation of the concepts herein disclosed should be recognized by those skilled in the art, and that such modifications and variations are considered to be within the scope of the systems and methods as defined by the appended claims.

Aspects, features and advantages of embodiments of the present disclosure will become apparent from the following description of embodiments in reference to the appended drawings.

Figure 10A:
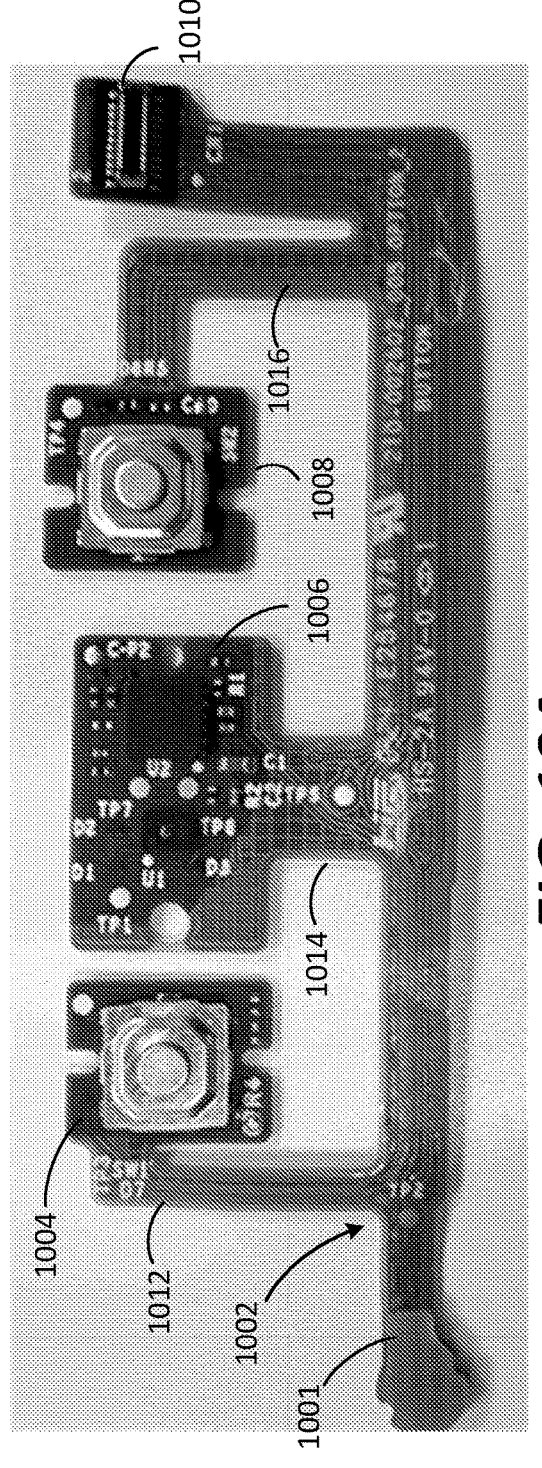
Figure 10B:
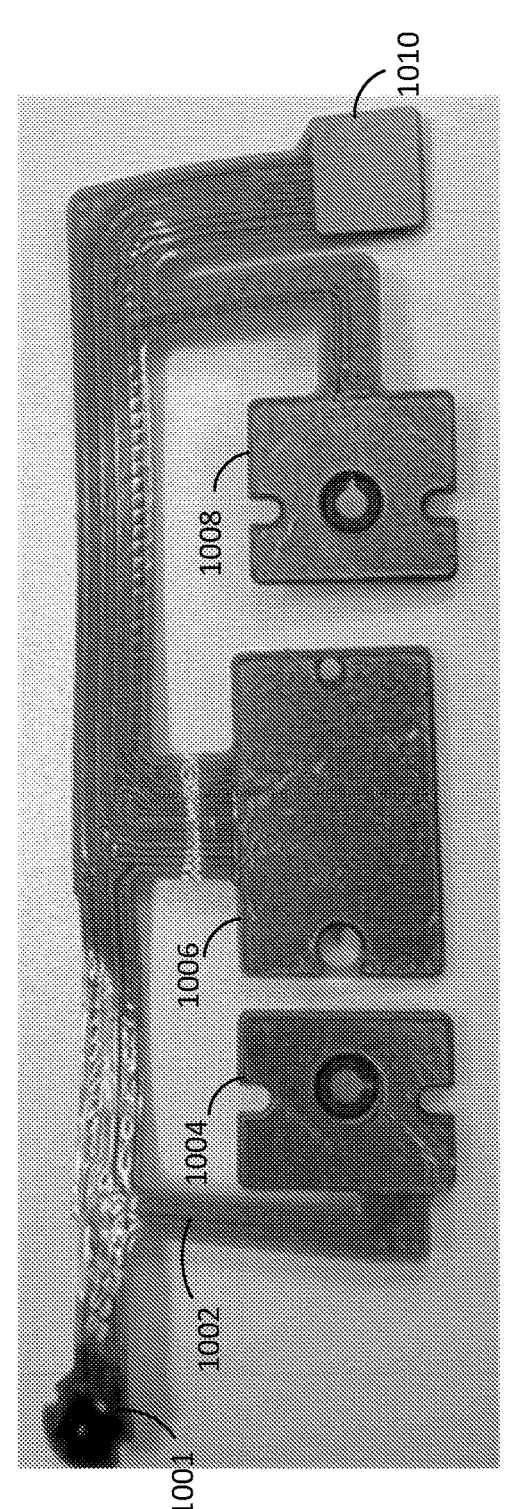
Figure 11:
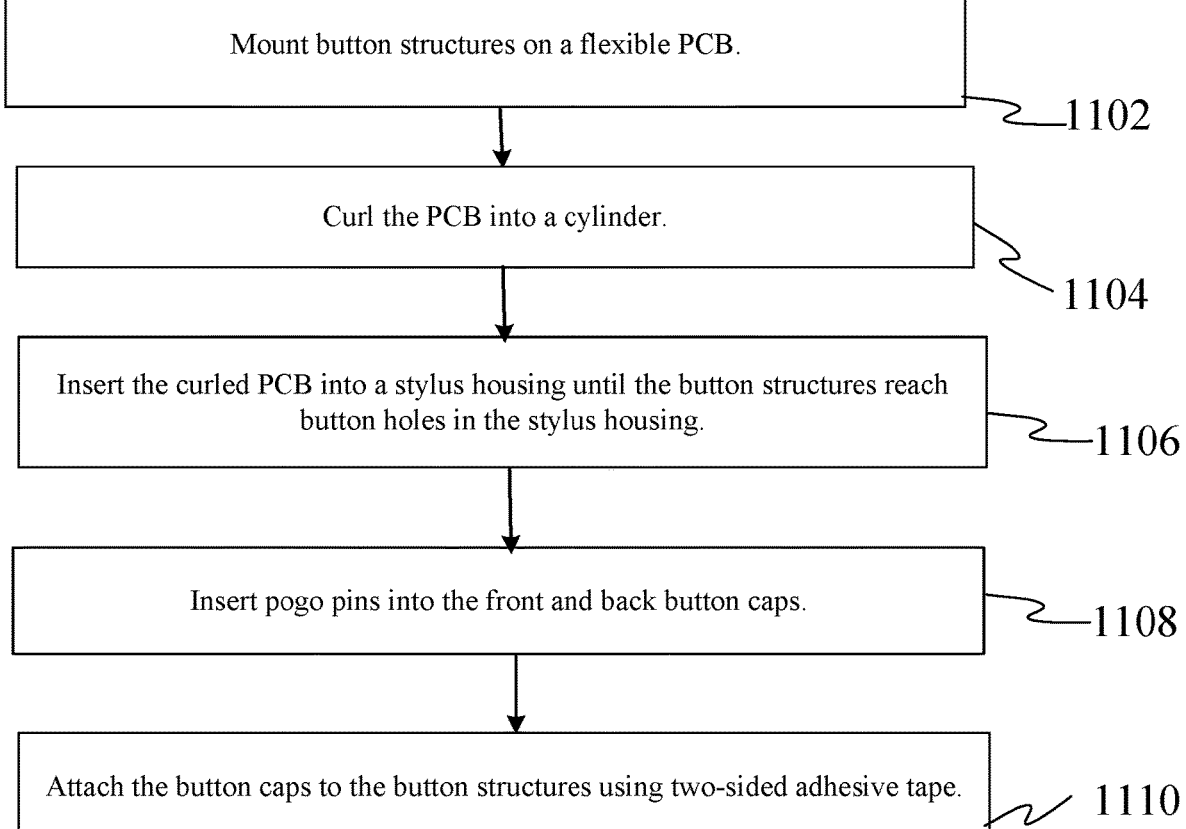
Figure 12:
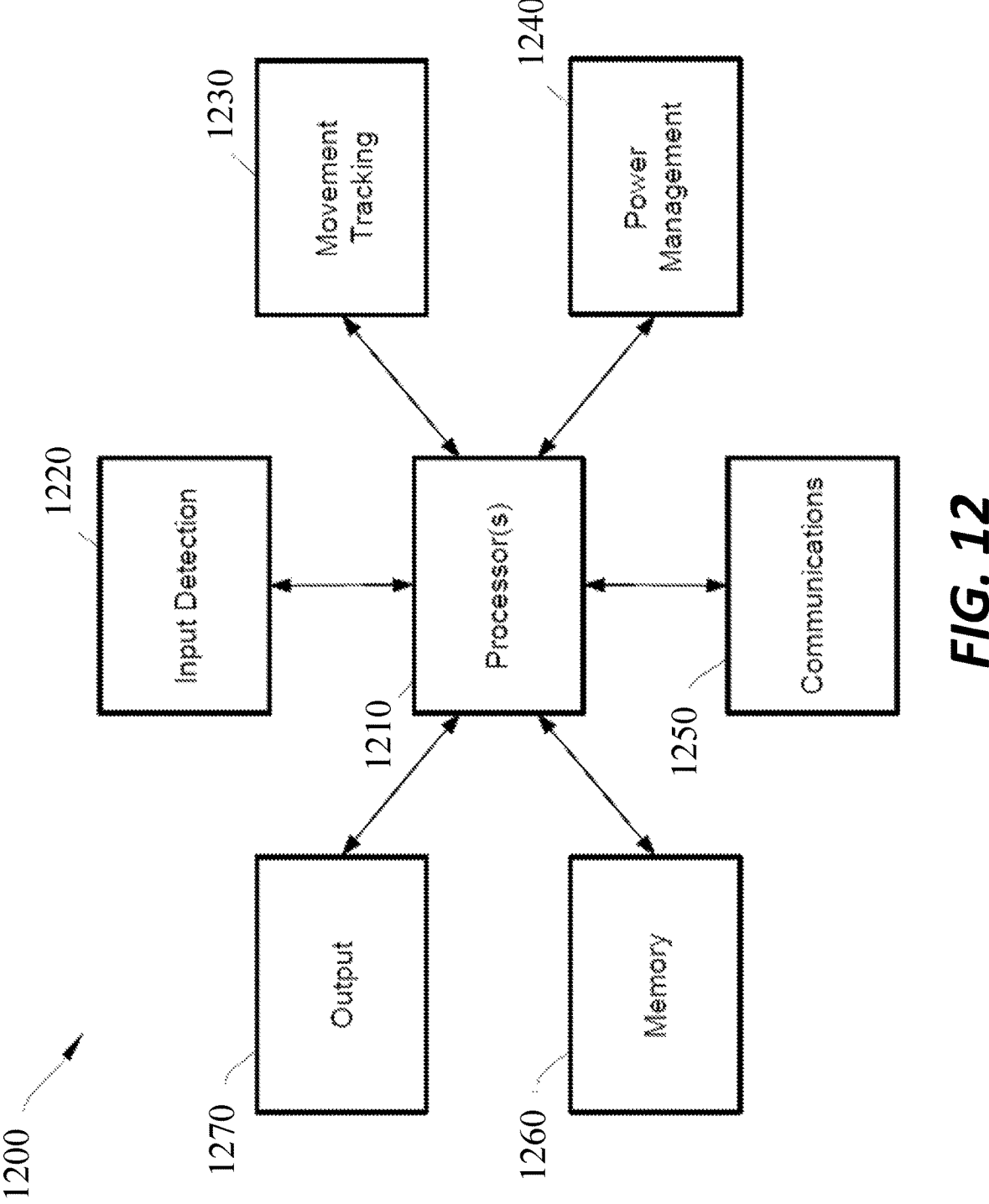

FIGS. 10A-B are diagrams of the bottom and top of a PCB connecting the buttons and associated electronics, according to certain embodiments;

FIG. 11 is a flow chart of a method for assembling the buttons into the stylus, according to certain embodiments; and FIG. 12 shows a simplified system block diagram for operating a stylus device, according to certain embodiments.

DETAILED DESCRIPTION OF THE INVENTION

Embodiments of this invention are generally directed to control devices with a curved surface and buttons, and configured to operate in AR/VR-based systems. More specifically, some embodiments relate to improving the capacitive detection of a capacitive detection button.

In the following description, for the purpose of explanation, numerous examples and details are set forth in order to provide an understanding of embodiments of the present invention. It will be evident, however, to one skilled in the art that certain embodiments can be practiced without some of these details, or with modifications or equivalents thereof.

To provide a high level, broad understanding of some aspects of the present disclosure, a non-limiting summary of certain embodiments are presented here. When capacitive detection buttons are used on a curved housing, the capacitive sensing electrode can be closer to the curved side of the housing than the button top. When the user grabs the stylus, it can cause side interference issue and the touch sensor will generate an incorrect touch event report. A conductive element is added to extend from the capacitive sensing electrode into the button. The conductive element is shaped such that it is closer to a top surface of the button than a side surface of the button and the curved housing, thus minimizing side interference.

In certain exemplary embodiments, the input device can be a stylus device configured for use in an augmented/virtual (AR/VR) reality environment.

Prior Art Controllers

Figure 1:
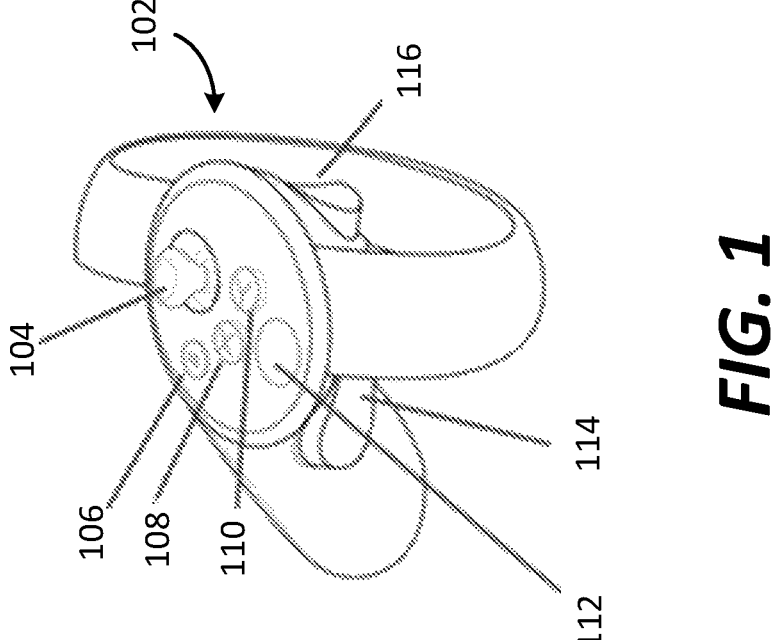
FIG. 1 is a diagram of a prior art controller for an augmented/virtual reality environment.

FIG. 1 is a diagram of a prior art controller 102 for an augmented/virtual reality environment. The controller has a thumb stick 104 and buttons 106, 108 and 110. Button 106 can be a start button, and buttons 108 and 110 can be X, Y buttons or A, B buttons. A touch button 112 is a thumb rest button. Two triggers are used, a hand trigger 114 and an index finger trigger 116.

Figure 2:
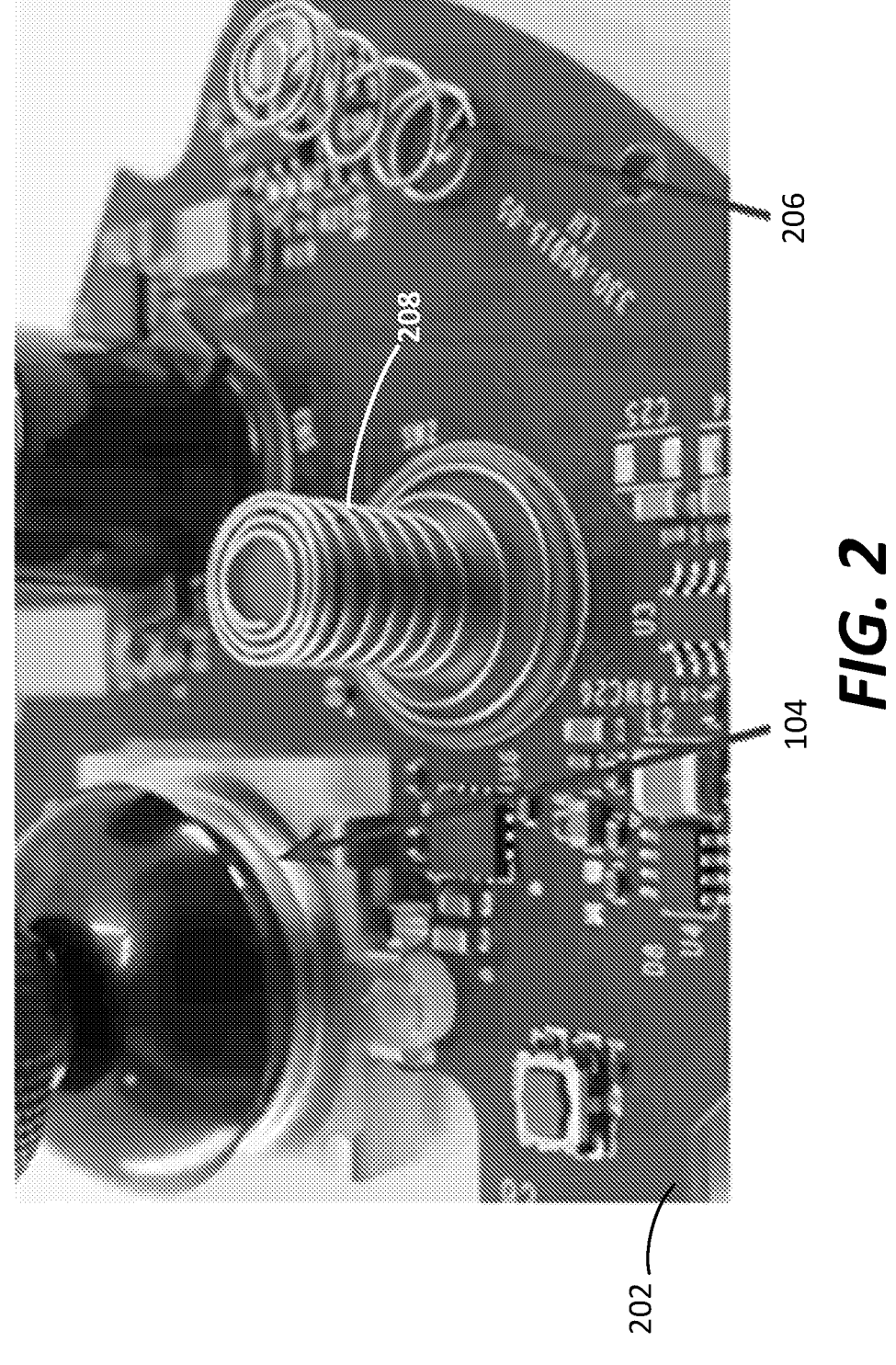
FIG. 2 is a diagram of a prior art spring conductor for a capacitive button of a controller for an augmented/virtual reality environment.

FIG. 2 is a diagram of a prior art spring conductor for a capacitive button of a controller 102 for an augmented/virtual reality environment. A Printed Circuit Board (PCB) 202 is mounted inside the controller. Thumb stick 104 can be seen protruding from the PCB 202. Springs 206 and 208 connect to capacitive electrodes, with the button caps being placed over them. These springs, in addition to providing the button rebound action, essentially extend the capacitive electrodes to the tip of the button caps. Since the button caps extend significantly from a planar surface, the springs can be nearly as wide as the button caps to maximize the detection of a finger on the top of the button.

Stylus for an Augmented/Virtual Reality Environment

Figure 3:
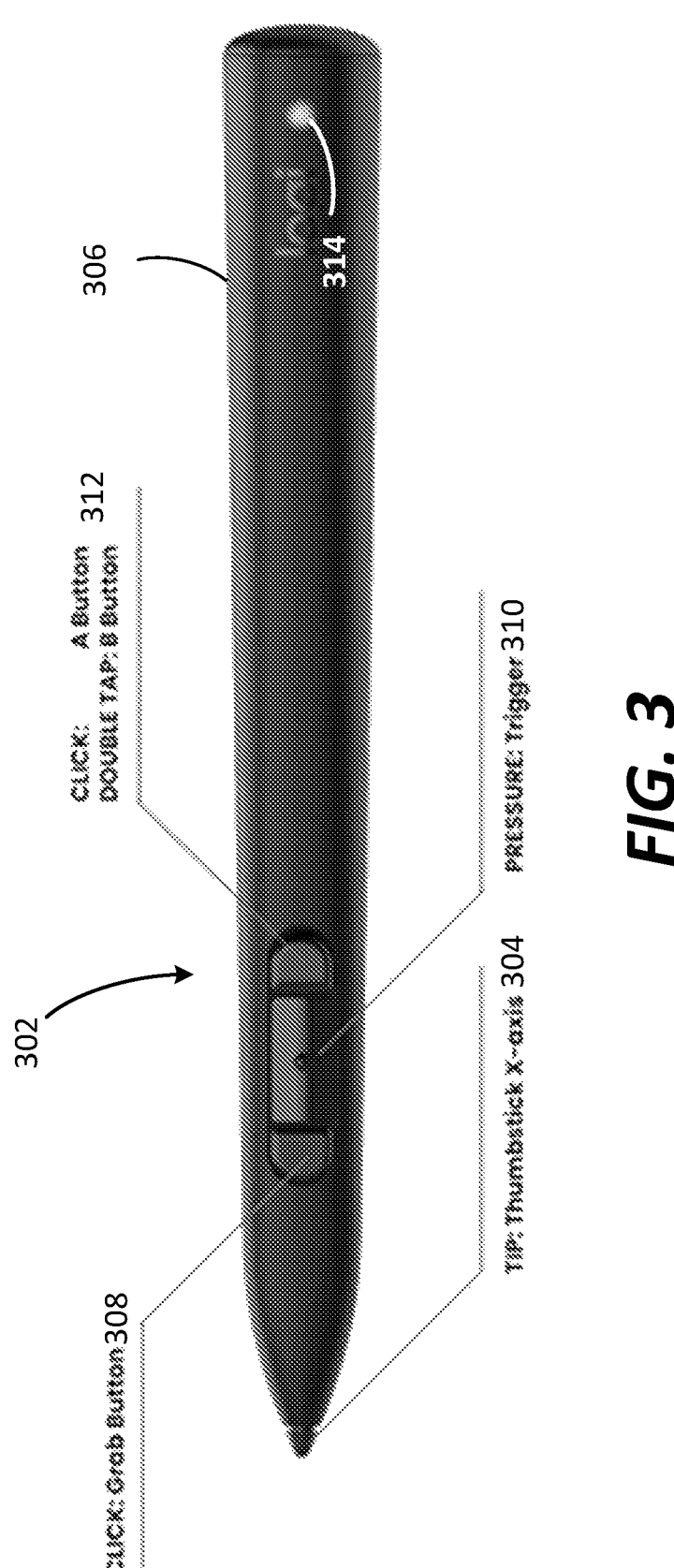
FIG. 3 is a diagram of a stylus for an augmented/virtual reality environment, according to certain embodiments.

FIG. 3 is a diagram of a stylus 302 for an augmented/virtual reality environment, according to certain embodiments. A tip 304 can be used for writing and drawing in the augmented/virtual reality environment. The tip acts as an x-axis thumb stick (or x, y z axis). Three buttons are positioned where they can be activated by a user's forefinger, buttons 308, 310, 312. These buttons can be assigned desired functions. For example, button 308 can be a capacitive grab button, button 310 can be a pressure-sensitive trigger and button 312 can have multiple functions. Button 312 can function as an A button with a click action by the user, and can function as a B button with a double tap by the user. If a touch is long enough, it is interpreted as a click. If a touch is short, the processor waits to see if there is another short touch within a short period, which is then interpreted as a double tap.

An LED 314 is used for tracking the position of the stylus by a camera of a head-mounted display or other cameral in the augmented/virtual reality environment. Although only one LED is shown to keep the diagram clear, typically multiple LEDs are used, with multiple LEDs at both the back and front of the stylus.

Figure 4:
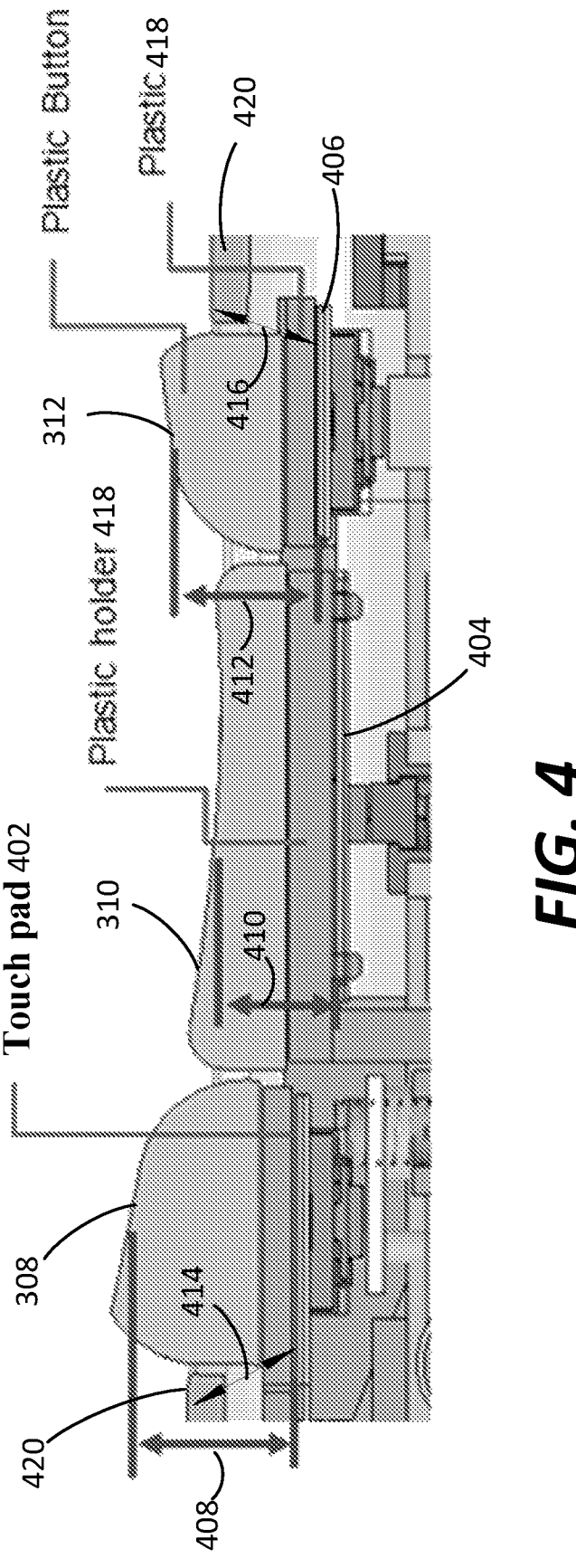
FIG. 4 is a cross-section diagram of the stylus along its length, according to certain embodiments.

FIG. 4 is a cross-sectional diagram of stylus 302 along its length in the area of the buttons, according to certain embodiments. Buttons 308, 310 and 312 are shown in cross-section. They not only protrude from the stylus surface 420 so the user can feel them, but they are also curved to fit the contour of a user's finger. This helps the user locate the buttons in virtual reality space, where the user can't see the buttons. The touch of a user's finger on a button is detected with a capacitive electrode (touch pad) for each button. These are shown as a capacitive electrode 402 for button 308, a pressure electrode 404 (e.g., a load cell) for button 310 and a capacitive electrode 406 for button 312. The distance between the electrodes and the top surface of their corresponding buttons are shown by arrows 408, 410 and 412. This can be contrasted with the distance to the surface 420 of the stylus housing near the buttons 408 and 412, as shown by arrows 414 and 416. As can be seen, the stylus surface 420 is closer to the electrodes, thus enabling a false button press detection when the user's finger is resting on the stylus housing near the buttons.

Also shown in FIG. 4 is the plastic holder 418, which holds the button caps in place. This adds to the distance between the capacitive electrodes and the top surface of the button caps.

Figure 5:
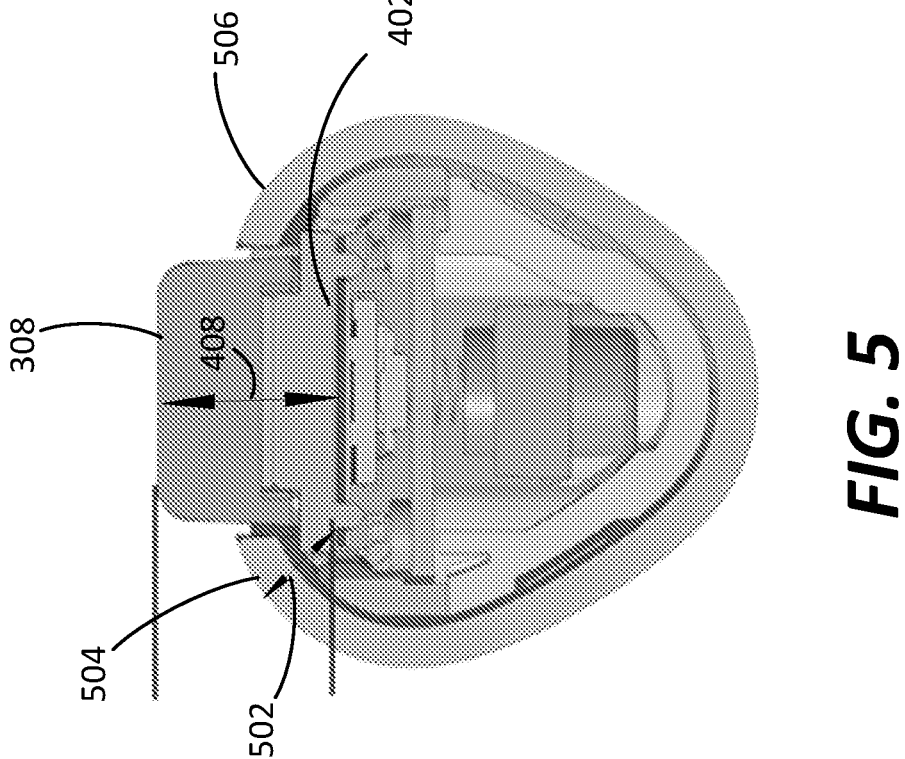
FIG. 5 is a cross-section diagram of a button of the stylus transverse to the cross section of FIG. 4, according to certain embodiments.

FIG. 5 is a cross-section diagram of button 308 of stylus 302 transverse to the cross section of FIG. 4, according to certain embodiments. Visible are portions 504 and 506 of the stylus housing to the side of the buttons. The distance from the capacitive electrode 402 to portions 504 and 506, illustrated by arrows 502, is shorter than the distance between capacitive electrode 402 and the top surface of button 308 as illustrated by arrows 408. In embodiments, the distance 408 is 4.5-5.0 millimeters, and it would be difficult to make that distance shorter because of the elements needed to provide the button. As can be seen, the stylus surface is closer to the electrodes, about half as close, thus enabling a false button press detection when the user's finger is resting on the stylus housing near the buttons. This presents a challenge for implementing capacitive sensing button on the form factor of a stylus. The need for the buttons to protrude so they can be tactilely felt by the user in a virtual environment causes even more distance between the capacitive electrode and the top surface of the button.

Figure 6:
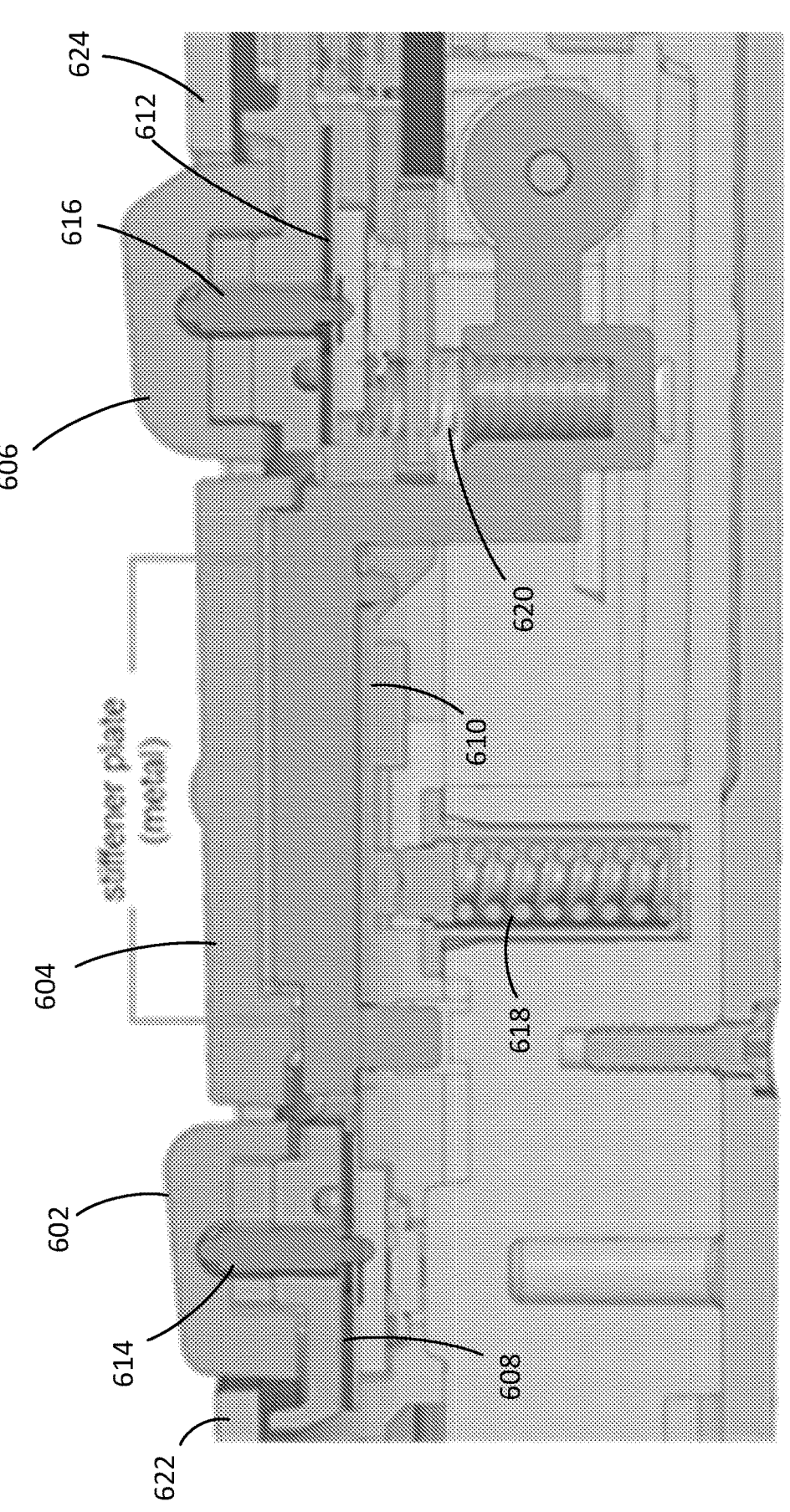
FIG. 6 is a cross-section diagram of a stylus along its length in the area of the buttons, showing the addition of a conductive element extending from the capacitive sensing electrode into the button, according to certain embodiments.

FIG. 6 is a cross-section diagram of stylus 302 along its length in the area of the buttons, showing the addition of a conductive element extending from the capacitive sensing electrode into the button, according to certain embodiments. This embodiment has a different curved profile for the button tops of buttons 602, 604 and 606. Below the buttons are electrodes 608, 610 and 612. A conductive element 614 is added, extending from the capacitive sensing electrode 608 into the cap of button 602. Another conductive element 616 is added, extending from the capacitive sensing electrode 612 into the cap of button 606. No conductive element is added for button 604, since it uses a pressure sensor and is not susceptible to the same false signals. The conductive elements are substantially closer to the button tops than the portions 622 and 624 of the stylus housing are to the capacitive electrodes 608 and 612.

In one embodiment, conductive elements 614 and 616 are pogo pins. The pogo pins have two cylindrical metal shells, with an internal spring. In other embodiments, the conductive elements could be other structures that both conduct electricity and can expand and contract with the pressing of the buttons. For example, springs could be used. Alternately, for a button that purely uses capacitive detection, without also detecting depression of the button, any solid metal conductor could be used. An articulating metal post could be used in another embodiment. A small metal plate or knob could be at the top of the post in another embodiment.

In the embodiment shown, the conductive element is narrow, so that a finger on top of the button is closer to the conductive element than a finger on stylus housing at the side of the button. If the conductive element were wide, and extended to near the sides of the button, a finger on the stylus next to the button, or partially resting on the side of the button, would trigger a capacitive response. In one embodiment, a distance between the conductive element and a top surface of the button cap is less than half a distance between the capacitive sensing electrode and the curved housing. In one embodiment, the conductive element (pogo pin) is within 2 millimeters of the top surface of the button cap. In another embodiment, the conductive element (pogo pin) is within 1 millimeter or less of the top surface of the button cap.

An advantage of the described embodiments is a simple, easy to manufacture structure. The narrow conductive element allows room for adhesive tape around the conductive element to bond the plastic button cap to the PCB structure. Also, a wider conductive element could be used, such as the wide springs shown in FIG. 2, but that would require additional shielding elements around the edge, to avoid false button press detections. However, in one embodiment, the pogo pin or conductive element has a wider top, such as a mushroom shape, to provide a conductor under more of the surface area of the top surface of the button cap.

Another advantage of the conductive element is that the capacitive sensor does not need to be as sensitive as it would be with a greater distance. This allows less charge on the capacitor, and thus a smaller capacitor can be used. The smaller capacitor requires less discharging, thereby extending the battery life of the stylus.

Figure 7:
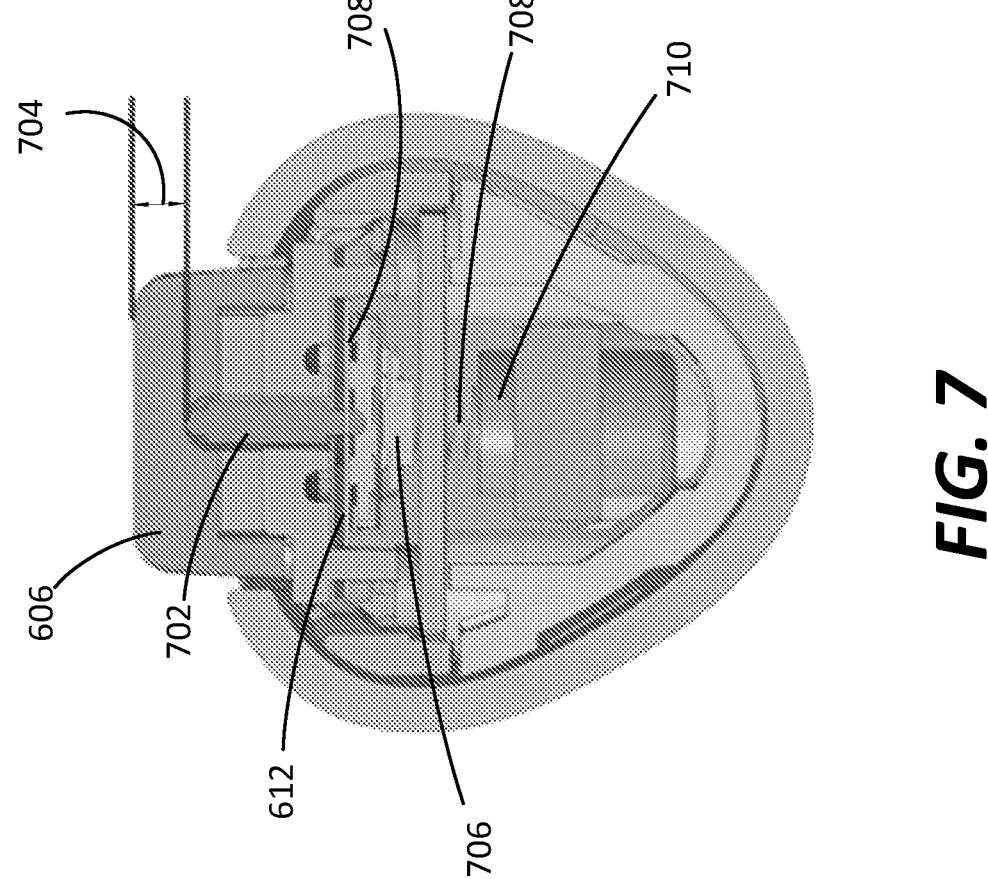
FIG. 7 is a cross-section diagram of a button of the stylus transverse to the cross section of FIG. 6, according to certain embodiments.

FIG. 7 is a cross-section diagram of a button of the stylus transverse to the cross section of FIG. 6, according to certain embodiments. A pogo pin 702 extends from conductive element 612 into plastic cap 606. In one embodiment, the distance 704 between the top of pogo pin 702 and the top surface of the button cap 606 is 1 millimeter. Also shown is a switch 706 for the click function, mounted upside down on a PCB 708. The capacitive electrode 612 is mounted on the PCB on the side opposite switch 706, above switch 706. A spring 708 is located between switch 706 and a support structure 710. When the user presses button cap 606, switch 706 will be activated by the force of the compression of spring 708. After the user removes the user's finger from the button, spring 708 will cause the switch, PCB, capacitive electrode, pogo pin and button cap to all return to their original position. The PCB is flexible, allowing the portion between the capacitive electrode and the switch to move up and down.

Figure 8:
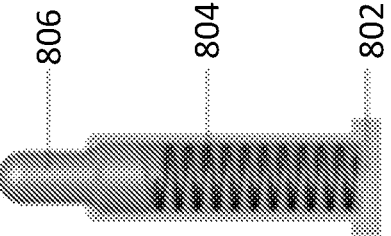
FIG. 8 is a cross-section diagram of a pogo pin with an internal spring, according to certain embodiments.

FIG. 8 is a cross-section diagram of a pogo pin with an internal spring, according to certain embodiments. The pogo pin has a hollow barrel 802. Inside the barrel is a spring 804. The spring biases a plunger 806 at the top of the barrel. The barrel, spring and plunger are all conductive, and conduct charge to the capacitive electrode.

Figure 9:
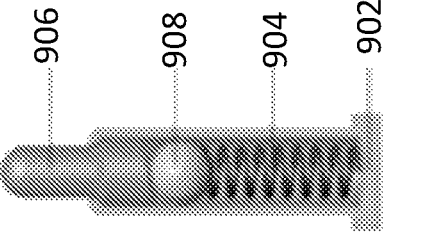
FIG. 9 is a cross-section diagram of a pogo pin with an internal spring and ball, according to certain embodiments.

FIG. 9 is a cross-section diagram of an alternative pogo pin with an internal spring and ball, according to certain embodiments. The pogo pin has a hollow barrel 902. Inside the barrel is a spring 904. The spring biases ball 908 against a plunger 906 at the top of the barrel.

FIGS. 10A-B are diagrams of the bottom and top of a PCB connecting the buttons and associated electronics, according to certain embodiments. A flexible PCB 1002 has wire traces to interconnect the components mounted on the PCB. The components include a tip sensor 1001, forward button structure 1004, middle button structure 1006, rear button structure 1008 and processor 1010. The wire traces interconnect the buttons and the processor. The processor also includes a transmitter for sending button presses and position and orientation information to a remote host. The stylus can also have tilt sensors and/or accelerometers for detecting the position and orientation of the stylus. Button structures 1004, 1006 and 1008 are connected to independent arms 1012, 1014 and 1016, respectively, of flexible PCB 1002. This allows each button structure to move, with the PCB, up and down independently of the other button structures and the rest of the PCB.

Assembly Method

In embodiments, PCB 1002 can be folded roughly into a cylinder, and then inserted into a cylindrical stylus housing. It is pushed inward until the button structures align with corresponding holes in the stylus. The button caps, with internal pogo pins, are then attached with adhesive tape, glue, or another mechanism. Alternatively, the pogo pins or other conductive elements are attached to the capacitive electrodes before inserting the PCB into the stylus. Since the pogo pins or other conductive elements can be compressed, they can be inserted this way, and then will pop out in the opening for the buttons. The button caps can then be attached over the pogo pins.

FIG. 11 is a flow chart of a method for assembling the buttons into the stylus, according to certain embodiments. In step 1102, button structures are mounted on a flexible PCB. In step 1004, the PCB is curled into a cylinder. In step 1006, the curled PCB is inserted into a stylus housing until the button structures reach button holes in the stylus housing. In step 1008, pogo pins are inserted into the front and back button caps. In step 1010, the button caps are attached to the button structures using two-sided adhesive tape.

In one embodiment, double-sided adhesive tape is attached to the button cap, with a center opening. The pogo pin is inserted into the center opening, which is narrow enough to grip the pogo pin and hold it in place, along with adhesive from the adhesive tape, while the button cap and pogo pin are inserted into the hole in the stylus housing until the adhesive tape contacts the edges of the button structure and the pogo pin is in slightly compressed contact with the capacitive electrode of the button structure.

In one embodiment, the pogo pin is inserted (press-fit or over molding) in each button cap such that it is in permanent contact with its respective capacitive sensing electrode. Effectively, the pin creates an electrical connection with the capacitive sensing electrode thus reducing the gap between the electrode and the top surface of the button where the user's finger naturally rests.

In one embodiment, the electrode is a copper area on a flexible PCB or Flexible Printed Circuit (FPC). Thus, the pogo pin is in contact with FPC through the capacitive sensing electrode. The pogo pin could also be a conductive spring, i.e. a structure that creates a permanent electrical connection while compensating for any assembly tolerance because its length is self-adjusted. Switches with a spring for the click function are mounted upside down underneath the FPC, and operate independently from the touch sensing operation. However, whole button+FPC+switch moves when depressing the button. Alternately, the switches could be mounted on a fixed structure and only the button would move.

Detection of Button Activations

Referring back to FIG. 3, three buttons are positioned where they can be activated by a user's forefinger, buttons 308, 310, 312. These buttons can be assigned desired functions. For example, button 308 can be a capacitive grab button, button 310 can be a pressure-sensitive trigger and button 312 can have multiple functions. The buttons are calibrated during manufacturing, so that a capacitance above a threshold is considered an activation of button 310. The use of the conductive element in the button cap allows this threshold to be lower, and still distinguish between a button press and the user's finger resting on the stylus next to the button.

Button 312 can function as an A button with a click action by the user, and can function as a B button with a double tap by the user. A click action is detected if the capacitive voltage exceeds an "A" threshold for a minimum amount of time. The use of the conductive element in the button cap allows this threshold to be lower. A "B" threshold, lower than the "A" threshold, is detected if the touch is shorter than the minimum amount of time. The processor then waits to see if there is another short touch within a short period, which is then interpreted as a double tap. The "B" threshold, like the "A" threshold, can be set lower due to the use of the conductive element in the button cap, while still distinguishing the user's finger simply resting on the stylus next to the button.

Simplified System Embodiment for a Stylus Device

FIG. 12 shows a simplified system block diagram ("system") 1200 for operating a stylus device, according to certain embodiments. System 1200 may include processor(s) 1210, input detection block 1220, movement tracking block 1230, power management block 1240, communication block 1250, memory block 1260, and output block 1270. Each of the system blocks 1220-1270 can be in electrical communication with processor(s) 1210. System 1200 may further include additional systems that are not shown or described to prevent obfuscation of the novel features described herein, but would be expected by one of ordinary skill in the art with the benefit of this disclosure.

The elements of FIG. 12 are mounted on the PCB of FIG. 10A. The conductive element or pogo pin will produce a larger signal from the capacitive electrode when a user's finger is directly on the button than when the finger is on the curved housing next to the button. The processor will thus reject signals below a threshold.

In certain embodiments, processor(s) 1210 may include one or more microprocessors (μCs) and can be configured to control the operation of system 1200. Alternatively or additionally, processor 1210 may include one or more microcontrollers (MCUs), digital signal processors (DSPs), or the like, with supporting hardware, firmware (e.g., memory, programmable I/Os, etc.), and/or software, as would be appreciated by one of ordinary skill in the art. Alternatively, MCUs, μCs, DSPs, ASIC, programmable logic device, and the like, may be configured in other system blocks of system 1200. For example, communications block 1250 may include a local processor to control communication with computer 110 or HMD 190 (e.g., via Bluetooth, Bluetooth LE, RF, IR, hardwire, ZigBee, Z-Wave, Logitech Unifying, or other communication protocol). In some embodiments, multiple processors may enable increased performance characteristics in system 1200 (e.g., speed and bandwidth), however multiple processors are not required, nor necessarily germane to the novelty of the embodiments described herein. Alternatively or additionally, certain aspects of processing can be performed by analog electronic design, as would be understood by one of ordinary skill in the art.

Input detection block 1220 can control the detection of button activation, scroll wheel, dial, trackball, roller manipulation (e.g., rotation detection), sliders, switches, touch sensors (e.g., one and/or two-dimensional touch pads), force sensors (e.g., nib and corresponding force sensor, button and corresponding force sensor), and the like. An activated input element (e.g., button press) may generate a corresponding control signal (e.g., human interface device (HID) signal) to control a computing device (e.g., a host computer) communicatively coupled to input device 150 (e.g., instantiating a "grab" function in the AR/VR environment). Alternatively, the functions of input detection block 1220 can be subsumed by processor(s) 1210, or in combination therewith. In some aspects, button press detection may be detected by a one or more sensors (also referred to as a sensor set), such as a load cell coupled to a button (or other surface feature). A load cell can be controlled by processor(s) 1210 and configured to detect an amount of force applied to the button or other input element coupled to the load cell. One example of a load cell is a strain gauge load cell (e.g., a planar resistor) that can be deformed. Deformation of the strain gauge load cell can change its electrical resistance by an amount that can be proportional to the amount of strain, which can cause the load cell to generate an electrical value change that is proportional to the load placed on the load cell. Load cells may be coupled to any input elements on stylus 302, as would be appreciated by one of ordinary skill in the art with the benefit of this disclosure.

In some embodiments, the load cell may be a piezo-type. Preferentially, the load cell should have a wide operating range to detect very light forces for high sensitivity detection (e.g., down to approximately 1 gram) to relatively heavy forces (e.g., up to 5+ Newtons). It is commonplace for a conventional tablet stylus to use up to 500 g on the tablet surface. However, in VR use (e.g., writing on a VR table or a physical whiteboard while wearing a VR HMD), typical forces may be much higher, thus 5+ Newton detection is preferable. In some embodiments, a load cell coupled to the nib (e.g., tip 310) may have an activation force that may range from 1 g to 10 g, which may be a default setting or set/tuned by a user via software/firmware settings. In some cases, a load cell coupled to the primary analog button may be configured with an activation force of 30 g (typically activated by the index finger). These examples are typical activation force settings, however any suitable activation force may be set as would be appreciated by one of ordinary skill in the art with the benefit of this disclosure. By comparison, 60-70 g are typically used for a mouse button click on a gaming mouse, and 120 g or more may be used to activate a button click function under a scroll wheel. A typical load cell size may be 4 mm×2.6 mm×2.06 mm, although other dimensions can be used.

In some embodiments, input detection block 1220 can detect a touch or touch gesture on one or more touch sensitive surfaces (e.g., touch pad). Input detection block 1220 can include one or more touch sensitive surfaces or touch sensors. Touch sensors generally comprise sensing elements suitable to detect a signal such as direct contact, electromagnetic or electrostatic fields, or a beam of electromagnetic radiation. Touch sensors can typically detect changes in a received signal, the presence of a signal, or the absence of a signal. A touch sensor may include a source for emitting the detected signal, or the signal may be generated by a secondary source. Touch sensors may be configured to detect the presence of an object at a distance from a reference zone or point (e.g., <5 mm), contact with a reference zone or point, or a combination thereof. Certain embodiments of stylus 302 may or may not utilize touch detection or touch sensing elements.

Input detection block 1220 can include touch and/or proximity sensing capabilities. Some examples of the types of touch/proximity sensors may include, but are not limited to, resistive sensors (e.g., standard air-gap 4-wire based, based on carbon loaded plastics which have different electrical characteristics depending on the pressure (FSR), interpolated FSR, etc.), capacitive sensors (e.g., surface capacitance, self-capacitance, mutual capacitance, etc.), optical sensors (e.g., infrared light barriers matrix, laser based diode coupled with photo-detectors that could measure the time-of-flight of the light path, etc.), acoustic sensors (e.g., piezo-buzzer coupled with microphones to detect the modification of a wave propagation pattern related to touch points, etc.), or the like. Stylus 302 may incorporate some or all of the input elements or any aspect of the stylus devices described in U.S. patent application Ser. No. 16/370,648 and U.S. Pat. No. 10,719,143, which are herein incorporated by reference in their entirety for all purposes.

Movement tracking block 1230 can be configured to track or enable tracking of a movement of stylus 302 in three dimensions in an AR/VR environment. For outside-in tracking systems, movement tracking block 1230 may include a plurality of emitters (e.g., IR LEDs) disposed on an input device, fiducial markings, or other tracking implements, to allow the outside-in system to track the input device's position, orientation, and movement within the AR/VR environment. For inside-out tracking systems, movement tracking block 1230 can include a plurality of cameras, IR sensors, or other tracking implements to allow the inside-out system to track the input device's position, orientation, and movement within the AR/VR environment. Preferably, the tracking implements (also referred to as "tracking elements") in either case are configured such that at least four reference points on the input device can be determined at any point in time to ensure accurate tracking. Some embodiments may include emitters and sensors, fiducial markings, or other combination of multiple tracking implements such that the input device may be used "out of the box" in an inside-out-type tracking system or an outside-in-type tracking system. Such embodiments can have a more universal, system-agnostic application across multiple system platforms.

In certain embodiments, movement detection block 1230 can include an inertial measurement unit (IMU) for tracking movement, e.g., of stylus 302. IMUs may be comprised of one or more accelerometers, gyroscopes, or the like. Accelerometers can be electromechanical devices (e.g., micro-electromechanical systems (MEMS) devices) configured to measure acceleration forces (e.g., static and dynamic forces). One or more accelerometers can be used to detect three-dimensional (3D) positioning. For example, 3D tracking can utilize a three-axis accelerometer or two two-axis accelerometers. Accelerometers can further determine a velocity, physical orientation, and acceleration of stylus 302 in 3D space. In some embodiments, gyroscope(s) can be used in lieu of or in conjunction with accelerometer(s) to determine movement or input device orientation in 3D space (e.g., as applied in an VR/AR environment). Any suitable type of IMU and any number of IMUs can be incorporated into stylus 302, as would be understood by one of ordinary skill in the art. In some embodiments, the optical tracking of the stylus device may be operated by movement detection block 1230. Movement tracking for a stylus device is described in further detail in U.S. Pat. No. 10,719,143, as noted above.

Power management block 1240 can be configured to manage power distribution, recharging, power efficiency, and the like, for stylus 302. In some embodiments, power management block 1240 can include a battery (not shown), a USB-based recharging system for the battery (not shown), and a power grid within system 1200 to provide power to each subsystem (e.g., communications block 1250, etc.). In certain embodiments, the functions provided by power management block 1240 may be incorporated into processor(s) 1210. Alternatively, some embodiments may not include a dedicated power management block. For example, functional aspects of power management block 1240 may be subsumed by another block (e.g., processor(s) 1210) or in combination therewith.

Communications block 1250 can be configured to enable communication between stylus 302 and an HMD, a host computer (not shown), or other devices and/or peripherals, according to certain embodiments. Communications block 1250 can be configured to provide wireless connectivity in any suitable communication protocol (e.g., radio-frequency (RF), Bluetooth, BLE, infra-red (IR), ZigBee, Z-Wave, Logitech Unifying, or a combination thereof), or other communication resources, as described above.

Memory block 1260 can include any suitable storage system (also referred to as a storage subsystem and computer readable medium/media). A storage subsystem can store one or more software programs to be executed by processors (e.g., in processor(s) 1210). It should be understood that "software" can refer to sequences of instructions that, when executed by processing unit(s) (e.g., processors, processing devices, etc.), cause system 1200 to perform certain operations of software programs. The instructions can be stored as firmware residing in read only memory (ROM) and/or applications stored in media storage that can be read into memory for processing by processing devices. Software can be implemented as a single program or a collection of separate programs and can be stored in non-volatile storage and copied in whole or in-part to volatile working memory during program execution. From a storage subsystem, processing devices can retrieve program instructions to execute in order to execute various operations (e.g., software-controlled spring auto-adjustment, etc.) as described herein. In some embodiments, memory block 1260 may store stylus device tracking sample points. In some aspects, memory block 1260 may store various smoothing algorithms (e.g., Catmull-Rom), as further described below.

Output block 1270 may control various output systems for stylus 302, according to certain embodiments. For instance, output control module 1260 may control a number of visual output elements (e.g., mouse cursor, LEDs, LCDs), displays, audio outputs (e.g., speakers), haptic output systems, or the like. In some cases, input signals generated by haptic devices can be received and processed by input detection block 1220, output block 1270, another suitable block, or a combination thereof. For example, an input signal can be an input voltage, charge, or current generated by a load cell (e.g., piezoelectric device) in response to receiving a force (e.g., user touch) on its surface. In some embodiments, input detection block 1220 may control an output of one or more haptic devices on stylus 302. For example, certain parameters that define characteristics of the haptic feedback can be controlled by input detection block 1220. Some input and output parameters can include a press threshold, release threshold, feedback sharpness, feedback force amplitude, feedback duration, feedback frequency, over voltage (e.g., using different voltage levels at different stages), and feedback modulation over time. Alternatively, haptic input/output control can be performed by processor 1210 or in combination therewith.

Although certain systems may not expressly discuss, they should be considered as part of system 1200, as would be understood by one of ordinary skill in the art. For example, system 1200 may include a bus system to transfer power and/or data to and from the different systems therein. While system 1200 is described with reference to particular blocks (e.g., input detection block 1220), it is to be understood that these blocks are defined for understanding certain embodiments of the invention and is not intended to imply that embodiments are limited to a particular physical arrangement of component parts. The individual blocks need not correspond to physically distinct components. Blocks can be configured to perform various operations, e.g., by programming a processor or providing appropriate processes, and various blocks may or may not be reconfigurable depending on how the initial configuration is obtained. Certain embodiments can be realized in a variety of apparatuses including electronic devices implemented using any combination of circuitry and software. Furthermore, aspects and/or portions of system 1200 may be combined with or operated by other subsystems as informed by design. For example, power management block 1240 and/or movement tracking block 1230 may be integrated with processor(s) 1210 instead of functioning as a separate entity.

One of ordinary skill in the art with the benefit of this disclosure would understand the many variations, modifications, and alternative embodiments thereof. While it may not be expressly stated in each and every embodiment described herein, it should be understood that any features described in one particular embodiment can be applied to any of the embodiments contemplated within this disclosure, and it can be assumed that one of ordinary skill in the art with the benefit of this disclosure would understand how to mix and match said features in any desired combination.

As used in this specification, any formulation used of the style "at least one of A, B or C", and the formulation "at least one of A, B and C" use a disjunctive "or" and a disjunctive "and" such that those formulations comprise any and all joint and several permutations of A, B, C, that is, A alone, B alone, C alone, A and B in any order, A and C in any order, B and C in any order and A, B, C in any order. There may be more or less than three features used in such formulations.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

Unless otherwise explicitly stated as incompatible, or the physics or otherwise of the embodiments, example or claims prevent such a combination, the features of the foregoing embodiments and examples, and of the following claims may be integrated together in any suitable arrangement, especially ones where there is a beneficial effect in doing so. This is not limited to only any specified benefit, and instead may arise from an "ex post facto" benefit. This is to say that the combination of features is not limited by the described forms, particularly the form (e.g. numbering) of the example(s), embodiment(s), or dependency of the claim(s).

Moreover, this also applies to the phrase "in one embodiment", "according to an embodiment" and the like, which are merely a stylistic form of wording and are not to be construed as limiting the following features to a separate embodiment to all other instances of the same or similar wording. This is to say, a reference to 'an', 'one' or 'some' embodiment(s) may be a reference to any one or more, and/or all embodiments, or combination(s) thereof, disclosed. Also, similarly, the reference to "the" embodiment may not be limited to the immediately preceding embodiment.

The foregoing description of one or more implementations provides illustration and description but is not intended to be exhaustive or to limit the scope of the invention to the precise form disclosed. Modifications and variations are possible in light of the above teachings or may be acquired from practice of various implementations of the present disclosure.

What is claimed:

1. A capacitive button for an input device, comprising:
a curved housing;
a button cap extending through an opening in the curved housing;
a capacitive sensing electrode mounted below the capacitive button;
a pogo pin extending from the capacitive sensing electrode into the capacitive button; and
wherein the pogo pin is shaped such that it is closer to a top surface of the button than the curved housing;
wherein a distance between the pogo pin and a top surface of the button cap is 1 millimeter or less;
wherein a distance between the pogo pin and a top surface of the button cap is less than half a distance between the capacitive sensing electrode and the curved housing;

a switch mounted below the capacitive sensing electrode to provide a click function; and
the capacitive sensing electrode and the switch being bonded together so that they move together in response to a user pressing the capacitive button.

2. The capacitive button of claim 1 wherein the input device is a stylus.

3. The capacitive button of claim 2 wherein the capacitive button is proximate a tip of the stylus.

4. The capacitive button of claim 3 wherein the stylus includes a second capacitive button spaced from the capacitive button and near the tip of the stylus.

5. The capacitive button of claim 4 wherein the stylus further comprises a pressure-sensitive button between the capacitive button and the second capacitive button.

6. The capacitive button of claim 5 wherein the capacitive button has a grab function, the pressure-sensitive button has a trigger function and the second capacitive button has multiple functions.

* * * * *